United States Patent
Seo et al.

(10) Patent No.: US 8,227,712 B2
(45) Date of Patent: Jul. 24, 2012

(54) FILTER AND DISPLAY DEVICE HAVING THE SAME

(75) Inventors: Ji Yoon Seo, ChungCheongNam-Do (KR); Dong Hyun Park, ChungCheongNam-Do (KR); Jin Sung Lim, ChungCheongNam-Do (KR); Dae Chul Park, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 305 days.

(21) Appl. No.: 12/478,941

(22) Filed: Jun. 5, 2009

(65) Prior Publication Data

US 2009/0301772 A1    Dec. 10, 2009

(30) Foreign Application Priority Data

Jun. 9, 2008    (KR) .................. 10-2008-0053686

(51) Int. Cl.
*H05K 9/00*    (2006.01)
*H02B 1/044*    (2006.01)

(52) U.S. Cl. .................. 174/381; 174/392; 174/389

(58) Field of Classification Search .................. 174/389, 174/392, 381; 313/313; 359/885
See application file for complete search history.

(56) References Cited

U.S. PATENT DOCUMENTS

| | | | |
|---|---|---|---|
| 6,686,536 B2* | 2/2004 | Tone et al. | 174/389 |
| 2007/0011863 A1* | 1/2007 | Yoshikawa | 29/592.1 |
| 2007/0195494 A1* | 8/2007 | Miyoshi et al. | 361/681 |
| 2007/0242177 A1* | 10/2007 | Lee et al. | 349/42 |

FOREIGN PATENT DOCUMENTS

| | | |
|---|---|---|
| JP | 2003-007218 A | 1/2003 |
| KR | 20070099830 A | 10/2007 |
| KR | 20080048373 A | 6/2008 |

* cited by examiner

*Primary Examiner* — Hung Ngo
(74) *Attorney, Agent, or Firm* — Lerner, David, Littenberg, Krumholz & Mentlik, LLP

(57) ABSTRACT

A filter for a display device is provided which includes a base substrate, an electromagnetic shielding layer formed on one surface of the base substrate to block electromagnetic waves, and an electrode formed along at least two sides among four sides of the base substrate to earth the electromagnetic shielding layer, thereby reducing the manufacturing costs while maintaining the capability of blocking electromagnetic waves.

11 Claims, 4 Drawing Sheets

FILTER AND DISPLAY DEVICE HAVING THE SAME

CROSS-REFERENCE TO RELATED APPLICATION

This application claims the benefit of Korean Patent Application No. 2008-0053686 filed on Jun. 9, 2008, in the Korean Intellectual Property Office, the disclosure of which is incorporated herein by reference.

BACKGROUND OF THE INVENTION

1. Field of the Invention

The present invention relates to a filter for a display device, and more particularly, to a filter for a display device which can reduce its manufacturing costs while maintaining its capability of blocking electromagnetic waves.

2. Description of the Related Art

As information is getting more important in the modern society, remarkably advanced image display devices and their parts are being distributed. The display devices include display devices for TVs, monitors of personal computers (PCs) and so on, and their distribution is greatly increasing. Further, the display devices are getting larger in a screen size and thinner at the same time.

In general, a plasma display panel (PDP) device is in the limelight as a next generation display device since it can be made larger in a screen size and thinner at the same time than a cathode ray tube (CRT), which is representative of existing display devices. The PDP device displays an image using a gas discharge phenomenon and has an excellent display performance in relation to a luminance, a contrast ratio, an image retention, a viewing angle, or the like. Further, the PDP device is in the spotlight as a display device which can replace the CRT device because the PDP device can be easily made larger in a screen size than other display devices and as a thinner image display device, the PDP device has the most suitable characteristics for future high quality digital televisions.

The PDP device applies a direct or alternating voltage to the electrodes to cause gas discharge and then ultraviolet radiation. The ultraviolet activates a fluorescent layer to generate light. However, the PDP device has drawbacks that electromagnetic interference (EMI), near infrared rays (NIR), and neon light of orange color are generated. The EMI is harmful to the human body, the NIR causes malfunction of precision appliances such as a remote controller, and the neon light deteriorates color purity.

Therefore, the PDP device employs a PDP filter in order to block electromagnetic waves and near infrared rays, reduce light reflection, and improve color purity.

The PDP filter of the related art includes a transparent substrate and functional layers such as an electromagnetic shielding layer, a neon light shielding layer, a near-infrared shielding layer and an anti-reflection layer, which are laminated on the transparent substrate.

The electromagnetic shielding layer is earthed to a case or the like of a display device so as to allow electromagnetic waves generated from a display panel to be discharged to the ground such as the case before reaching display viewers.

However, such a PDP filter of the related art has a problem that manufacturing cost is high because a grounding path of electromagnetic waves between the electromagnetic shielding layer and the ground such as the case is inefficient.

SUMMARY OF THE INVENTION

The present invention has been made to solve the foregoing problems with the related art, and therefore one or more objects of the present invention are to provide a filter for a display device in which a grounding path of electromagnetic waves for an electromagnetic shielding layer is simplified so as to reduce manufacturing cost while maintaining the capability of blocking electromagnetic waves.

One or more objects of the present invention are directed to provide a filter for a display device, which includes a base substrate, an electromagnetic shielding layer formed on one surface of the base substrate to block electromagnetic waves, and an electrode formed along at least two sides among four sides of the base substrate to earth the electromagnetic shielding layer.

In an exemplary embodiment of the invention, the electrode is an electro-conductive metallic foil covering at least two side faces of the base substrate. Alternatively, the electrode may be made by printing an electro-conductive metallic paste along the at least two sides of the base substrate.

In an exemplary embodiment of the invention, the electrode is provided along upper and lower sides or left and right sides of the base substrate.

In another exemplary embodiment of the invention, the electrode is formed along the four sides of the base substrate in a mesh pattern.

In an exemplary embodiment of the invention, the electrode has an opening ratio of 85% or less and an opening size of 1.5 mm or less.

According to the above-described structures, the electrode grounding the electromagnetic shielding layer is formed along the at least two sides of the base substrate, thereby reducing the manufacturing cost while maintaining the capability of blocking electromagnetic waves.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EXEMPLARY EMBODIMENT

The present invention will now be described more fully hereinafter with reference to the accompanying drawings, in which exemplary embodiments thereof are shown.

Figure 1:
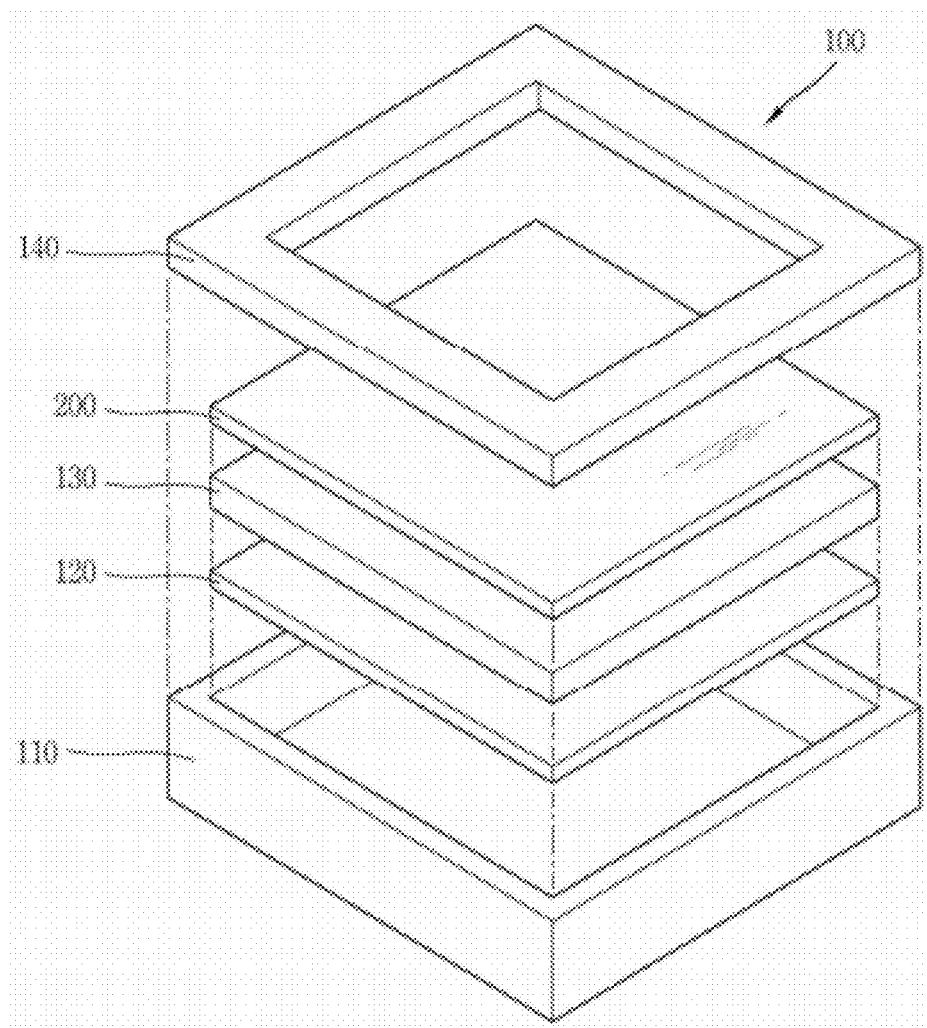
FIG. 1 is an exploded perspective view illustrating a display device according to the present invention.

FIG. 1 is an exploded perspective view illustrating a display device according to the present invention.

As illustrated in FIG. 1, the display device 100 includes a case 110, a cover 140 covering an upper portion of the case 110, a drive circuit board 120 received in the case 110, a display panel 130 including discharge cells, in which a gas discharge phenomenon occurs, and a filter 200.

Figure 2:
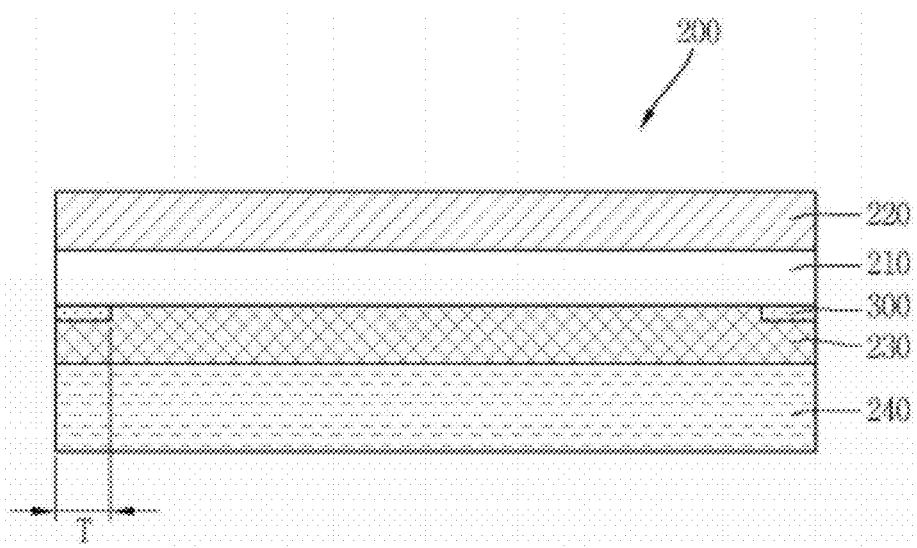
FIG. 2 is a cross-sectional view illustrating a filter for a display device according to a first embodiment of the present invention.

As illustrated in FIG. 2, the filter 200 according to a first embodiment of the invention includes a base substrate 210, an anti-reflection layer 220 formed on one side of the base substrate 210, an electromagnetic shielding layer 230 and a color compensating layer 240, the latter two layers 230 and 240 being formed on the other side of the base substrate 210.

The base substrate 210 may be made of tempered or heat-strengthened glass or a transparent plastic material such as acryl. While glass has drawbacks in that it has heavy specific gravity of 2.6 and thick thickness and thus makes the display device heavy, it serves to prevent a scattering.

In an embodiment of the invention, the base substrate 210 may be composed of an inorganic compound such as glass, quartz, etc., or a transparent organic polymer material. The organic polymer material may be more preferable because it is light and hard to break.

The base substrate 210 is typically composed of acryl or polycarbonate but the present invention is not limited thereto. The base substrate 210 preferably has high transparency and heat resistance. The base substrate may be a substrate of polymer or a multi-layered substrate of polymer. In the base substrate 210, it is preferable that transmittance of visible light is 80% or more in terms of the transparency and glass transition temperature is 60° C. or more in terms of the heat resistance. The polymer material transmits visible light, and may be composed of polyethylene terephthalate (PET), polysulfone (PS), polyether sulfone (PES), polystyrene, polyethylene naphthalate, polyarylate, polyether ether ketone (PEEK), polycarbonate (PC), polypropylene (PP), polyimide, triacetylcelluose (TAC), polymethyl methacrylate (PMMA), etc, but the present invention is not limited thereto. Among them, polyethylene terephthalate (PET) is preferable from the viewpoints of price, heat resistance and transparency.

The anti-reflection layer 220 is formed on a surface of the base substrate 210. That is, the anti-reflection layer 220 is advantageously formed on the surface of the base substrate facing a viewer when the filter 200 is mounted on a display device, i.e. the surface opposite to the display panel 130. Such an anti-reflection layer 220 can reduce the reflection of external light to improve visibility.

Of course, the anti-reflection layer 220 may also be formed on the surface of the filter 200 facing the display panel 130 so as to further reduce the reflection. Such a structure of the anti-reflection layer 220 can improve transmittance of visible light from the display panel 130 and a contrast ratio. The anti-reflection layer 220 may be formed on the surface of the base substrate 210 through applying, printing or diverse known film-forming methods of the related art. Alternatively, the anti-reflection layer may be provided by bonding an anti-reflection film on the surface of the base substrate using any transparent adhesive.

In detail, the anti-reflection layer 220 may consist of a thin film of fluoric transparent polymer resin, magnesium fluoride, silicone resin, silicon oxide, etc, a refractive index of which is 1.5 or less, preferably 1.4 or less in a visible range. Such an anti-reflection layer may have the thickness of e.g. a quarter of a wavelength of light. The anti-reflection layer 220 may include two or more thin films (layers) of an inorganic compound, such as metal oxide, fluoride, silicide, boride, carbide, nitride, sulfide, etc., or an organic compound, such as silicone resin, acryl resin, fluoric resin, etc, refractive indexes of which films are different from each other.

Here, while the single-layered anti-reflection layer 220 is easily fabricated, it has lower anti-reflectivity than the multi-layered anti-reflection layer. The multi-layered anti-reflection layer has anti-reflectivity over a wide range of wavelength. Such an inorganic compound film may be formed by means of a conventional known method such as sputtering, ion-plating, ion beam-assist, vacuum vapor deposition, wet coating, or the like, and such an organic compound film may be formed by means of a conventional known method such as wet coating or the like.

For example, the anti-reflection layer 220 according to an embodiment of the invention may have a hybrid structure in which a low reflective oxide film such as $SiO_2$ and a high reflective oxide film such as $TiO_2$ or $Nb_2O_5$ are alternately laminated. Such oxide films may be formed by means of physical vapor deposition or wet coating.

The electromagnetic shielding layer 230 includes a conductive mesh type or a multilayered transparent conductive film type in which a metal film and high-refractive transparent film are laminated together.

Here, the conductive mesh type may generally use a metal mesh, a metal-coated synthetic resin mesh or a metal-coated metal fiber mesh. As the metal for the conductive mesh type, any metal with good conductivity and machinability, for example, copper, chrome, nickel, silver, molybdenum, tungsten, aluminum, or the like can be used.

The electromagnetic shielding layer of a transparent conductive film type can use a high-refractive transparent film such as an Indium Tin Oxide (ITO) film to block electromagnetic waves.

In the electromagnetic shielding layer of the multilayered transparent conductive film type, a metal film of Au, Ag, Cu, Pt, Pd, etc. and a high refractive transparent film of indium oxide, tin dioxide, zinc oxide, etc. may be alternately laminated on each other.

In an embodiment of the invention in which the electromagnetic shielding layer 230 of the multilayered transparent conductive film type with the metal film and high refractive transparent film is used, the electromagnetic shielding layer 230 has the effect of blocking near-infrared rays. Thus, in this case, the electromagnetic shielding layer 230 can perform two functions of blocking both near-infrared rays and electromagnetic waves without additionally providing the above-mentioned near-infrared shielding layer. Of course, even in this case, the near-infrared shielding layer may also be provided.

In an embodiment of the invention in which the electromagnetic shielding layer 230 of the conductive mesh type is used, the filter can use polymer resin containing a near-infrared absorption material which can absorb light having wavelengths of near-infrared region in order to block near-infrared rays emitted from a panel assembly. As the near-infrared absorption material, diverse organic absorption materials, such as a cyanine type absorption material, an anthraquinone type absorption material, a naphtoquinone type absorption material, a phthalocyanine type absorption material, a naphthalocyanine type absorption material, a diimonium type absorption material, a nickel dithiol type absorption material, etc. may be used.

The color compensating layer 240 may contain a color compensating colorant, which reduces or controls the amount of light of red (R), green (G) and/or blue (B) so as to change or correct a color balance. While the color compensating layer 240 has been illustrated in FIG. 2 to be formed on the surface of the electromagnetic shielding layer 230, the present invention is not limited thereto and the color compensating layer may be formed at other places.

Generally, visible light of red color emitted from plasma in a display panel tends to exhibit orange color. A conventional color compensating layer mainly serves to correct the orange color having a wavelength ranging from 580 nm to 600 nm into red color. However, according to an embodiment of the present invention, an adhesive layer may be made to perform a color compensating function by absorbing the orange color having a wavelength of 580~600 nm. In such an embodiment, the function of the color compensating layer of correcting orange color into red color can be reduced or the color compensating layer may be eliminated.

The color compensating layer 240 uses various kinds of colorants, namely dyes or pigments, in order to increase a range of the color reproduction of display and degree of definition. The colorants may include an organic pigment having a function of blocking neon light, such as anthraquinone dye, cyanine dye, azo dye, styryl dye, phthalocyanine dye, methyl dye, or the like. Since the sort and concentration of the colorants are determined by an absorption wavelength and an absorption coefficient of the colorant, and a transmittance required for a display filter, they are not limited to specified values.

The electrode 300 is provided along at least two sides among four sides of the base substrate 210 so as to earth the electromagnetic shielding layer 230 to the ground such as the case 110 of a display device.

The electrode 300 is made to have a certain width on the base substrate 230 such that one surface of the electrode comes into contact with the electromagnetic shielding layer 230 and the electrode is earthed to the ground such as the case of the display device. Electromagnetic waves emitted from the display panel are blocked by the electromagnetic shielding layer 230 and is discharged to the ground such as the case 110 via the electrode 300.

As illustrated in FIG. 2, the electrode 300 can be made by printing paste of copper or silver powders on the two sides on one surface of the base substrate 210. Alternatively, as illustrated in FIG. 3, an electrode 310 may be a high-conductive metallic foil covering two side faces of the base substrate 210.

Here, the metallic foil may be composed of copper or silver. Instead of cooper or silver, foils of any metallic materials having high conductivity can be used.

Figure 3:
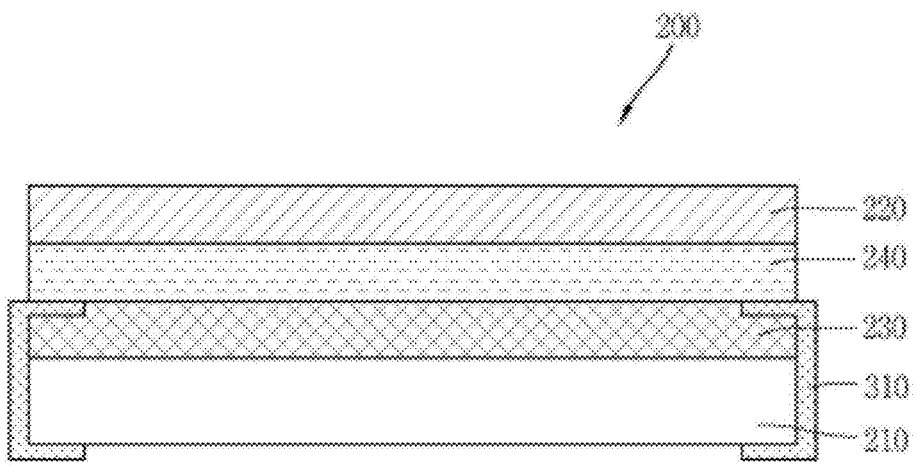
FIG. 3 is a cross-sectional view illustrating a filter for a display device according to a second embodiment of the present invention.

In fabricating the electrode 310 of the metallic foil type in FIG. 3, an electromagnetic shielding layer is formed on a non-reinforced base substrate and a metallic foil with a certain width is bonded covering a side face of the base substrate 210. In this case, since non-reinforced glass can be used as the base substrate, there is cost-saving effect.

In fabricating the electrode 300 in FIG. 2 using the paste, an electro-conductive metallic paste is screen-printed in a certain width on a side of the base substrate 210, the base substrate is reinforced, and then the electromagnetic shielding layer 230 is formed thereon.

When earthed in a backward direction, the electrode 300 of the conductive metallic foil may be bonded in a clamp-like shape on a side face of the base substrate 210 as illustrated in FIG. 3. When earthed to a front direction, the electrode 310 of the copper or silver powder may be printed in a paste state on the surface of the base substrate 310 as illustrated in FIG. 2.

Figure 4:
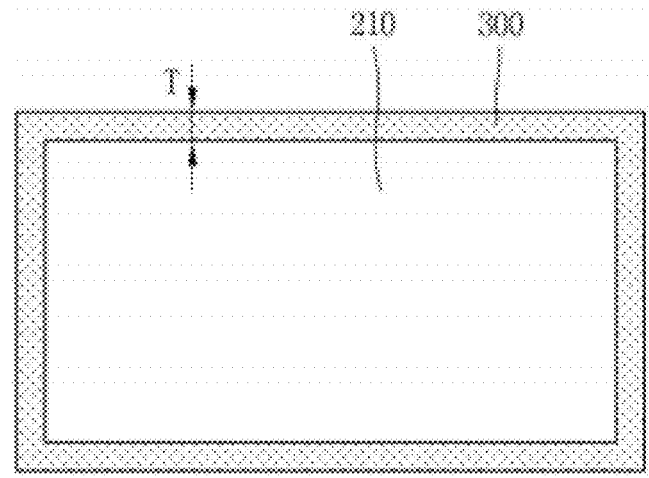
FIG. 4 is a front view illustrating an electrode according to a third embodiment of the present invention.

The electrode 300 may be provided in a certain width along the four sides of the base substrate 210 as illustrated in FIG. 4. In this case, the width T of the electrode 300 may have a range of preferably 5 mm~30 mm, more preferably about 17 mm.

Here, material costs can be reduced as the width T of the electrode 300 is smaller. In case that the width T exceeds 5 mm, electromagnetic waves reaching viewers are substantially similar. Accordingly, it may be preferable that the width has a range of 5 mm to 30 mm, for cost reduction.

Figure 5:
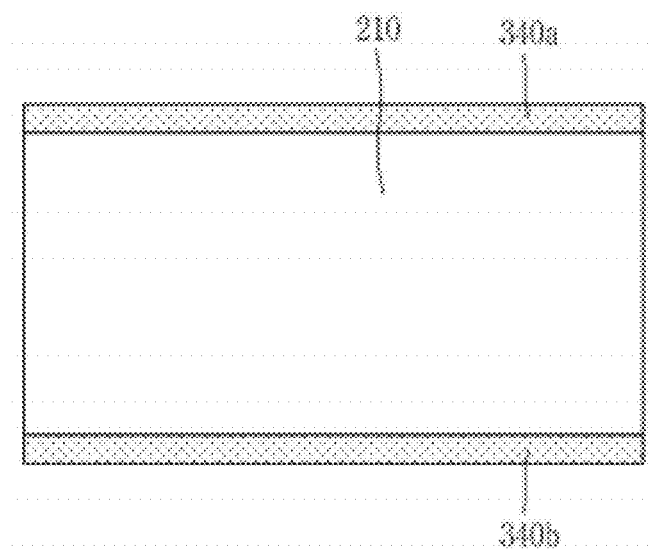
FIG. 5 is a front view illustrating an electrode according to a fourth embodiment of the present invention.

FIG. 5 is a front view illustrating an electrode according to a fourth embodiment of the present invention.

The electrode 340a and 340b of the fourth embodiment is formed along only upper and lower sides of the base substrate 210. That is, the electrode 340a and 340b is formed along only two sides of the base substrate 210, so that the material, copper or silver, forming the electrode 340a and 340b and therefore the material costs can be reduced. While the electrode of the fourth embodiment has a reduced contact area as compared to the electrode 300 of the third embodiment, tests proved that the capability of blocking electromagnetic waves is not substantially reduced.

Figure 6:
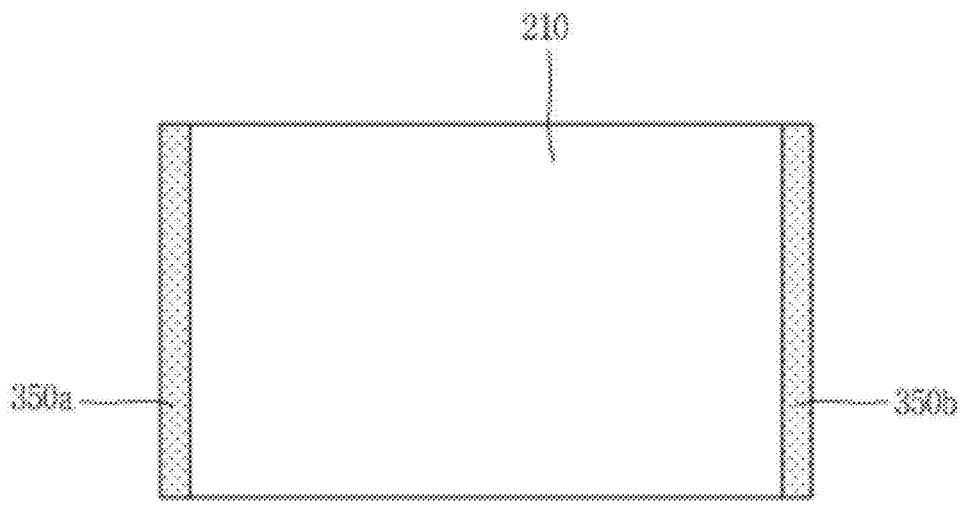
FIG. 6 is a front view illustrating an electrode according to a fifth embodiment of the present invention.

FIG. 6 is a front view illustrating an electrode according to a fifth embodiment of the present invention.

The electrode 350a and 350b of the fifth embodiment is formed along only left and right sides of the base substrate 210. That is, the electrode 350a and 350b is also formed along only two sides of the base substrate 210, so that the material, copper or silver, forming the electrode 350a and 350b and therefore the material costs can also be reduced. While the electrode of the fifth embodiment has a reduced contact area as compared to the electrode 300 of the third embodiment, tests proved that the capability of blocking electromagnetic waves is not substantially reduced.

Further, the electrode may be formed along any one of upper and lower sides and any one of left and right sides. That is, the electrode may be formed along upper and left sides, upper and right sides, lower and left sides, or lower and right sides.

It may be preferable that such an electrode is formed along only two sides among the four sides of the base substrate 210.

Figure 7:
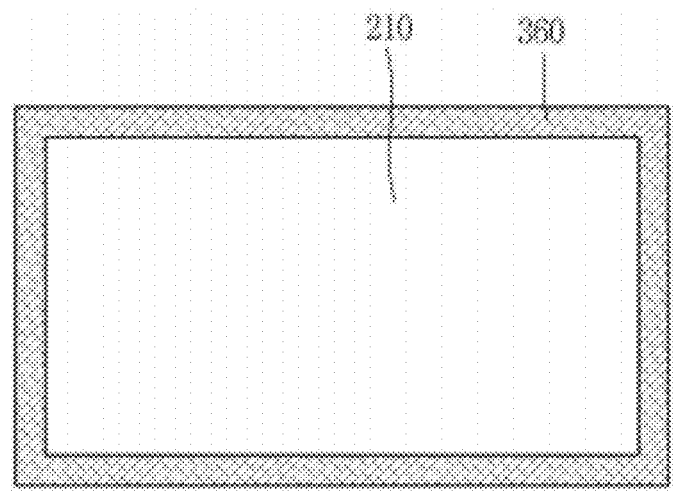
FIG. 7 is a front view illustrating an electrode according to a sixth embodiment of the present invention.

FIG. 7 is a front view illustrating an electrode according to a sixth embodiment of the present invention.

The electrode 360 may be formed in a mesh pattern along sides of the base substrate 210. Since the electrode 360 has the mesh pattern, the amount of the material forming the electrode is advantageously reduced. However, the capability of blocking electromagnetic waves is similar to that of the third embodiment.

In the mesh type electrode 360, an opening ratio is preferably, 85% or less, more preferably, 82%, which makes it possible to minimize the amount of material of the electrode while maintaining the capability of blocking electromagnetic waves.

An opening size of the mesh pattern is preferably, 1.5 mm or less, and more preferably, 1.2 mm.

Table 1 shows the results of measurement for each embodiment of the invention.

TABLE 1

| Embodiments | Measuring Position/ Method | Freq. Range 30~230 (MHz) | Freq. Range 230~1000 (MHz) | Resistance and Width of Electrode |
|---|---|---|---|---|
| 3rd Embodiment (Four Sides) | *H-F | 39.7 dB (µV/m) | 33.0 dB (µV/m) | 0.008 Ω |
| | **H-360° Rotation | 39.7 dB (µV/m) | 35.0 dB (µV/m) | 17 mm |
| | ***V-F | 34.5 dB (µV/m) | 42.0 dB (µV/m) | |
| | ****V-360° Rotation | 34.7 dB (µV/m) | 42.0 dB (µV/m) | |
| 4th Embodiment (Upper and lower | *H-F | 37.3 dB (µV/m) | 33.5 dB (µV/m) | 0.008 Ω |
| | **H-360° Rotation | 37.5 dB (µV/m) | 33.5 dB (µV/m) | 17 mm |
| | ***V-F | 36.6 dB (µV/m) | 39.0 dB (µV/m) | |
| | ****V- | 39.1 dB (µV/m) | 39.0 dB (µV/m) | |

TABLE 1-continued

| Embodiments | Measuring Position/ Method | Freq. Range 30~230 (MHz) | Freq. Range 230~1000 (MHz) | Resistance and Width of Electrode |
|---|---|---|---|---|
| | 360° Rotation | | | |
| 5th Embodiment (Left and Right Sides) | *H-F | 36.5 dB (μV/m) | 33.5 dB (μV/m) | 0.008 Ω 17 mm |
| | **H-360° Rotation | 36.5 dB (μV/m) | 33.5 dB (μV/m) | |
| | ***V-F | 39.6 dB (μV/m) | 39.0 dB (μV/m) | |
| | ****V-360° Rotation | 39.8 dB (μV/m) | 39.0 dB (μV/m) | |
| 6th Embodiment (4-Side Mesh Type) | *H-F | 38.5 dB (μV/m) | 41.5 dB (μV/m) | 0.008 Ω 17 mm |
| | **H-360° Rotation | 38.6 dB (μV/m) | 41.7 dB (μV/m) | |
| | ***V-F | 39.8 dB (μV/m) | 44.3 dB (μV/m) | |
| | ****V-360° Rotation | 39.9 dB (μV/m) | 44.5 dB (μV/m) | |

Note
*H-F: Horizontal - Front
**H-360°Rotation: Horizontal - 360° Rotation
***V-F: Vertical - Front
****V-360°Rotation: Vertical - 360° Rotation As shown in Table 1, when the width and resistance of the electrode are set to be 17 mm and 0.008Ω, respectively, the third embodiment in which the electrode is formed along the four sides of the base substrate, the fourth embodiment in which the electrode is formed along the upper and lower sides of the base substrate, the fifth embodiment in which the electrode is formed along the left and right sides of the base substrate, and the sixth embodiment in which the electrode is formed in a mesh pattern along the four sides of the base substrate have the similar results of measurement.

Therefore, in order to reduce the material costs of the electrode and at the same time, maintain the capability of blocking electromagnetic waves, it is preferable that the electrode which is formed using a paste is provided along two sides, for example, upper and lower sides or left and right sides of the base substrate, and the electrode in a mesh pattern is provided along the four sides of the base substrate.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A filter for a display device, the filter comprising:
a base substrate;
an electromagnetic shielding layer formed on one surface of the base substrate to block electromagnetic waves; and
an electrode formed along at least two sides among four sides of the base substrate to earth the electromagnetic shielding layer, wherein the electrode is formed in a mesh pattern and has an opening ratio of 85% or less, and wherein an opening size of the mesh pattern is 1.5 mm or less.

2. The filter for a display device according to claim 1, wherein the electrode is an electro-conductive metallic foil covering at least two side faces of the base substrate.

3. The filter for a display device according to claim 1, wherein the electrode is made by printing an electro-conductive metallic paste along the at least two sides of the base substrate.

4. The filter for a display device according to claim 1, wherein a width of the electrode ranges from 5 mm to 30 mm.

5. The filter for a display device according to claim 1, wherein the electrode is formed along upper and lower sides of the base substrate.

6. The filter for a display device according to claim 1, wherein the electrode is formed along left and right sides of the base substrate.

7. The filter for a display device according to claim 1, wherein the electrode is formed along one of upper and lower sides and one of left and right sides of the base substrate.

8. The filter for a display device according to claim 1, wherein the electrode is formed along the four sides of the base substrate.

9. The filter for a display device according to claim 1, wherein the electromagnetic shielding layer comprises any one of a conductive mesh and a conductive film.

10. The filter for a display device according to claim 1, further comprising at least one of an anti-reflection layer, a color compensating layer, and a near-infrared shielding layer.

11. A display device comprising: a display panel displaying an image; and a filter,
wherein the filter comprises: a base substrate; an electromagnetic shielding layer formed on one surface of the base substrate to block electromagnetic waves; and an electrode formed along at least two sides among four sides of the base substrate to earth the electromagnetic shielding layer, wherein the electrode is formed in a mesh pattern and has an opening ratio of 85% or less, and wherein an opening size of the mesh pattern is 1.5 mm or less.

* * * * *